United States Patent
Feldbaumer et al.

(10) Patent No.: US 6,570,916 B1
(45) Date of Patent: May 27, 2003

(54) ADAPTIVE EQUALIZATION CIRCUIT AND METHOD

(75) Inventors: David W. Feldbaumer, Chandler, AZ (US); Mark B. Weaver, Phoenix, AZ (US); Rimon Shookhtim, Mesa, AZ (US); Cecil Aswell, Orangevale, CA (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 08/811,414

(22) Filed: Mar. 4, 1997

(51) Int. Cl.[7] ................................................. H03H 7/40
(52) U.S. Cl. ...................................................... 375/232
(58) Field of Search ................................. 375/232, 230, 375/371, 229; 708/323; 333/18, 28 R

(56) References Cited

U.S. PATENT DOCUMENTS

| | | | |
|---|---|---|---|
| 3,694,752 A | * 9/1972 | Gibson ........................ 375/232 |
| 3,992,616 A | * 11/1976 | Acker ........................ 708/323 |
| 4,144,489 A | * 3/1979 | Ward et al. .............. 324/76.62 |
| 4,677,648 A | 6/1987 | Zurfluh ....................... 375/120 |
| 4,688,246 A | * 8/1987 | Eilers et al. .................. 375/359 |
| 5,185,768 A | 2/1993 | Ferraiolo et al. ............ 375/119 |
| 5,692,013 A | * 11/1997 | Koslov et al. ............... 375/277 |
| 5,694,422 A | * 12/1997 | Kaku et al. .................. 708/323 |
| 5,721,755 A | * 2/1998 | Kim et al. .................... 375/259 |
| 5,734,680 A | * 3/1998 | Moore et al. ................ 375/263 |
| 5,764,695 A | * 6/1998 | Nagaraj et al. .............. 375/232 |
| 5,805,637 A | * 9/1998 | Hirosaka et al. ............. 375/230 |
| 5,995,544 A | * 11/1999 | Cherubini et al. ........... 375/232 |

* cited by examiner

Primary Examiner—Tesfaldet Bocure
Assistant Examiner—Kevin M Burd

(57) ABSTRACT

A timing based adaptive equalization circuit (10) dynamically monitors a signal received at an input terminal (16) and compensates for attenuation losses in the transmission of the signal by adjusting an equalization value that increases or decreases the equalization of the signal. A digital phase locked loop control circuit (26) centers the transition of the equalized signal in a delay line circuit (31). An analog delay locked loop circuit (29) provides a fixed throughput time for matching delay elements of delay line circuits (31, 41 and 51) in the adaptive equalization circuit (10). Timing signals propagating in the delay line circuits (31, 41 and 51) are stored in sampler circuits (36, 46 and 56). The equalization value for equalizing the input signal is adjusted based on stored logic values of specific storage elements in the sampler circuits (46 and 56).

5 Claims, 2 Drawing Sheets

ADAPTIVE EQUALIZATION CIRCUIT AND METHOD

BACKGROUND OF THE INVENTION

The present invention relates, in general, to integrated circuits and, more particularly, to equalization of an input signal in an integrated circuit.

Data transmission over a communication channel requires differentiation of received data between a logic one and a logic zero data value. Communication channels suffer from lossy interconnect paths that cause distortion of signal waveforms. To correct for signal distortion and allow recovery of received data, signals at the input of a receiver are equalized to restore the effects of the communication channel on the transmitted signal.

An equalizer circuit receives a transmitted data signal and compensates for signal losses by restoring the original frequency content of the signal. The amount of equalization that is necessary to compensate for signal loss is dependent on the frequency of the data signal, channel loss characteristics, and the strength of the transmitted signal. Equalizer circuits that only provide a constant equalization of the received signal improperly compensate for varying communication channel loss.

Accordingly, it would be advantageous to have an equalization circuit and method that provides a low error rate in the differentiation of logic one and logic zero data values. It would be of further advantage to provide an equalization circuit that independently adjusts the amount of equalization such that the channel loss is offset. The equalization circuit should adapt to correct for a range of expected channel losses. Furthermore, the circuit should be expandable to accommodate multiple data channels rather than a single data channel.

DETAILED DESCRIPTION OF THE DRAWINGS

Generally, the present invention provides proper equalization for an input signal by compensating for degradation caused in the transmission of the signal. There is an optimum point during each symbol period at which the received signal should be sampled to ascertain when proper equalization has been achieved. The optimum point corresponds to the center of the data symbol which is found using a digital phase locked loop to allow precise and repeatable locking of the asynchronous data symbol to a receiver reference clock. An adaptive equalization circuit in accordance with the present invention provides proper equalization for signals transmitted over a communications channel such as, for example, either electrical or optical data channels. After proper equalization the logic values of the input signal are recovered and the data error rate for receiving transmitted data is improved.

Figure 1:
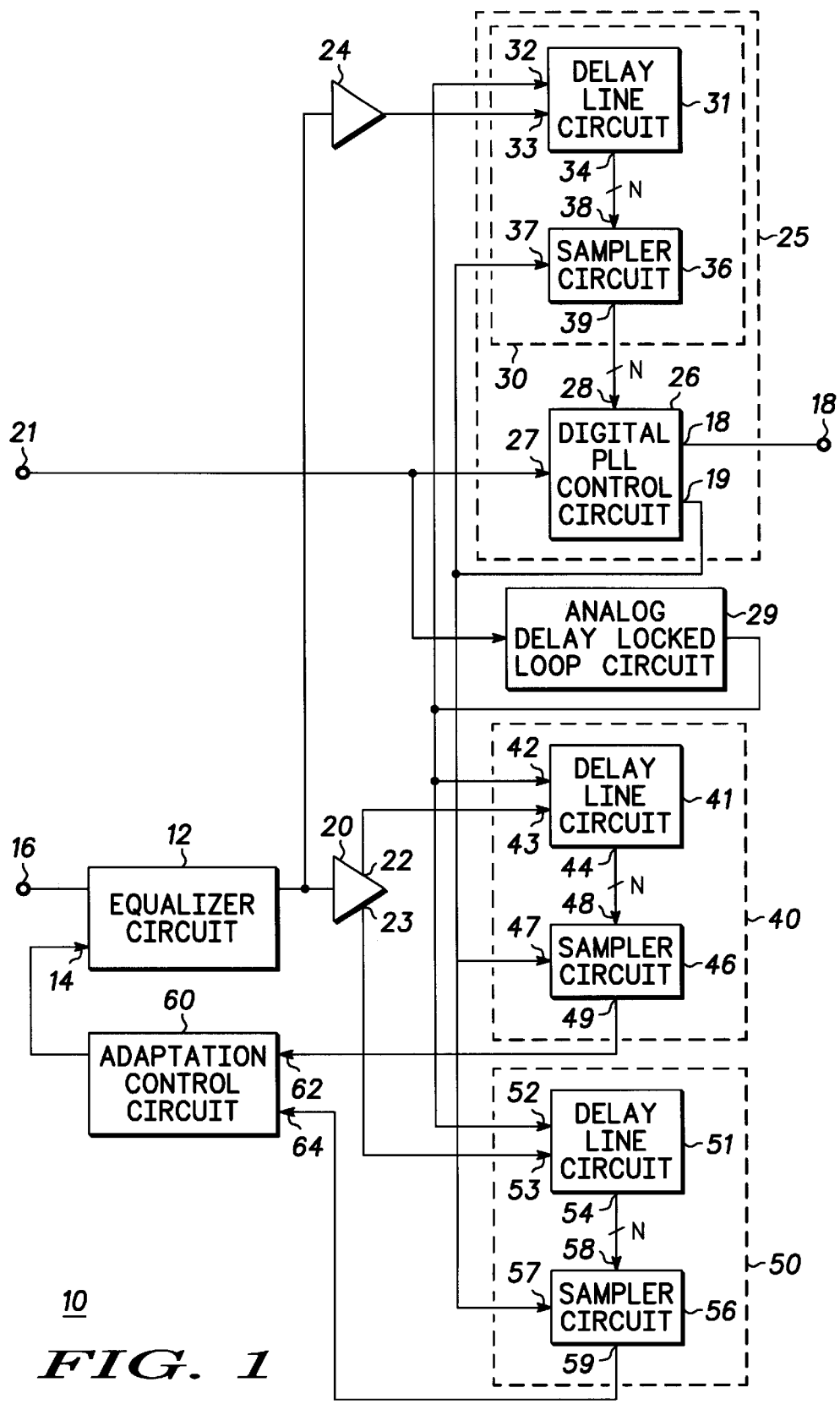
FIG. 1 is a block diagram of an adaptive equalization circuit in accordance with the present invention.

FIG. 1 is a block diagram of an adaptive equalization circuit 10 in accordance with the present invention. Adaptive equalization circuit 10 is also referred to as a data and clock recovery system. Adaptive equalization circuit 10 includes an equalizer circuit 12, a window slicer 20, a zero-crossing data slicer 24, a digital phase locked loop 25, an analog delay locked loop circuit 29, a timing capture circuit 40, a timing capture circuit 50, and an adaptation control circuit 60. Adaptive equalization circuit 10 has an input terminal 16 that is coupled for receiving an attenuated input signal, an input terminal 21 that is coupled for receiving an external reference clock signal, and an output terminal 18. In particular, equalizer circuit 12 has one input that serves as input terminal 16 of adaptive equalization circuit 10 and another input 14 that receives a feedback equalization value.

Window slicer 20 has an input connected to the output of equalizer circuit 12 and outputs 22 and 23 that provide digital waveforms sliced with respect to non-zero reference levels. Zero-crossing data slicer 24 has an input connected to the output of equalizer circuit 12 and an output that provides a digital waveform sliced with respect to a single reference level such as, for example, zero volts.

Digital Phase Locked Loop (PLL) 25 includes a timing capture circuit 30 and a digital PLL control circuit 26. Timing capture circuit 30 includes a delay line circuit 31 and a sampler circuit 36. Delay line circuit 31 has an input 32, an input 33, and an output 34. Sampler circuit 36 has an input 37, an input 38, and an output 39. Digital PLL control circuit 26 has an input 27, an input 28, an output 18, and an output 19. Output 18 of digital PLL control circuit 26 serves as output terminal 18 of adaptive equalization circuit 10. In particular, output 34 of delay line circuit 31 is connected to input 38 of sampler circuit 36. Input 33 of delay line circuit 31 is connected to the output of zero-crossing data slicer 24. Output 39 of sampler circuit 36 is connected to input 28 of digital PLL control circuit 26. By way of example, the connection between output 34 and input 38 and the connection between output 39 and input 28 are bus connections each having about twenty connection lines. It should be noted that the number of bus connections N, where N is an integer, is not a limitation of the present invention.

Analog delay locked loop circuit 29 has an input and an output. The input of analog delay locked loop circuit 29 is commonly connected to input 27 of digital PLL control circuit 26 and serves as input terminal 21 of adaptive equalization circuit 10. Input terminal 21 is coupled for receiving an external reference clock signal.

Timing capture circuit 40 includes a delay line circuit 41 and a sampler circuit 46. Delay line circuit 41 has an input 42, an input 43, and an output 44. Sampler circuit 46 has an input 47,, an input 48, and an output 49. In particular, output 44 of delay line circuit 41 is connected to input 48 of sampler circuit 46. Input 43 of delay line circuit 41 is connected to output 22 of window slicer 20. By way of example, the connection between output 44 and input 48 is a bus connection having about twenty connection lines.

Timing capture circuit 50 includes a delay line circuit 51 and a sampler circuit 56. Delay line circuit 51 has an input 52, an input 53, and an output 54. Sampler circuit 56 has an input 57, an input 58, and an output 59. In particular, output 54 of delay line circuit 51 is connected to input 58 of sampler circuit 56. Input 53 of delay line circuit 51 is connected to output 23 of window slicer 20. By way of example, the connection between output 54 and input 58 is a bus connection having about twenty connection lines.

Delay line circuit 41 and delay line circuit 51 have an equal number of similar delay elements compared to delay line circuit 31. By way of example, delay line circuits 31, 41, and 51 are analog delay chains each having about twenty delay elements. A fixed throughput time of about one unit time per delay element is set by a reference voltage from analog delay locked loop circuit 29. Although delay line circuits 31, 41, and 51 are described as having twenty delay elements, it should be understood that the number of delay elements is not a limitation of the present invention.

Adaptation control circuit 60 has an input 62, an input 64, and an output. Input 62 is connected to output 49 of sampler circuit 46 and input 64 is connected to output 59 of sampler circuit 56. The output of adaptation control circuit 60 is connected to input 14 of equalizer circuit 12.

It should be noted that the output of digital PLL control circuit 26 is commonly connected to inputs 37, 47, and 57 of sampler circuits 36, 46, and 56, respectively. Also, the output of analog delay locked loop circuit 29 is commonly connected to inputs 32, 42, and 52 of delay line circuits 31, 41, and 51, respectively.

Figure 2:
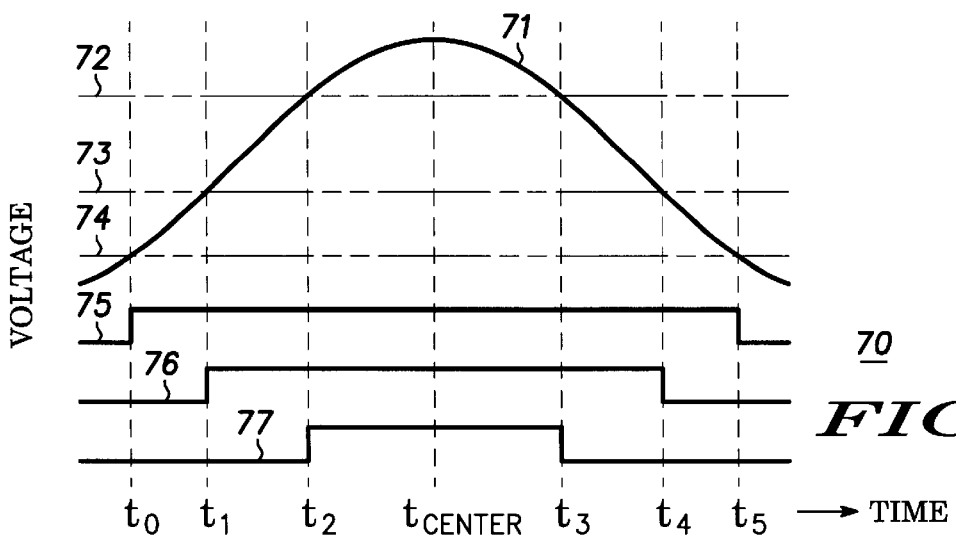
FIG. 2 is a plot of waveforms for an over-equalized input signal in accordance with the present invention.

FIG. 2 is a plot 70 of a waveform 71 for an over-equalized input signal in accordance with the present invention. The vertical direction represents a voltage amplitude while the horizontal direction represents time. Waveform 71 is the signal at the output of equalizer circuit 12 (FIG. 1) and is one bit of data having a logic one value for one bit time as defined by the symbol rate. It should be noted that one bit of data as represented from time $t_0$ to $t_5$ is also referred to as a data symbol. A window-high reference level 72 and a window-low reference level 73 represent reference voltages generated for use in window slicer 20 that have values with respect to a reference value represented by zero line 74. The output of zero-crossing data slicer 24 supplies sliced data signal 75. Sliced data signal 75 transitions at times $t_0$ and $t_5$ when waveform 71 has a voltage value that is about the same as the reference value of zero line 74. Window-low data signal 76 transitions at times $t_1$ and $t_4$ when waveform 71 has a voltage value that is about the same as the reference value of window-low reference level 73. Window-high data signal 77 transitions at times $t_2$ and $t_3$ when waveform 71 has a voltage value that is about the same as the reference value of window-high reference level 72. The time $t_{CENTER}$ occurs at the center of the data symbol of waveform 71.

Figure 3:
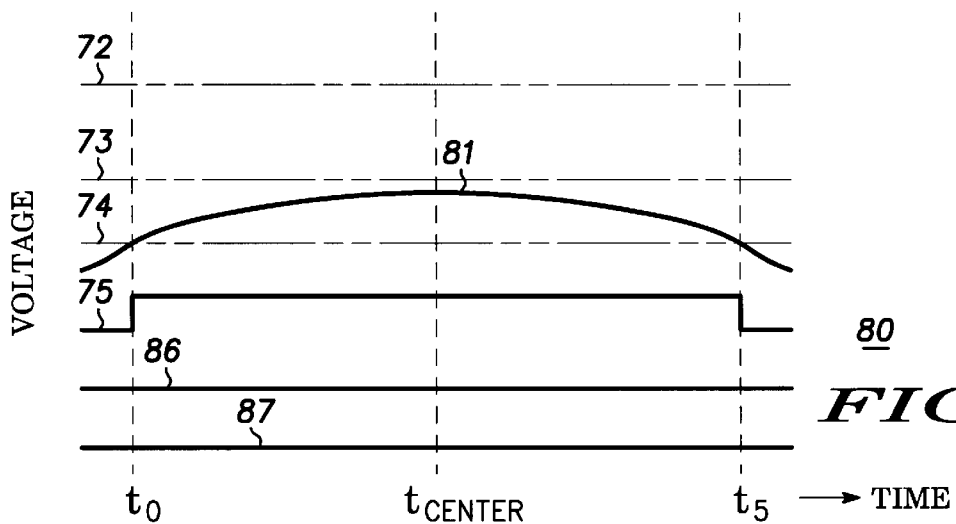
FIG. 3 is a plot of waveforms for an under-equalized input signal in accordance with the present invention.

FIG. 3 is a plot 80 of a waveform 81 for an under-equalized input signal in accordance with the present invention. The vertical direction represents a voltage amplitude while the horizontal direction represents time. Waveform 81 at the output of equalizer circuit 12 (FIG. 1) is one bit of data having a logic one value for one clock cycle. It should be noted that the same reference numbers are used in the figures to denote the same elements. Sliced data signal 75 transitions at times to and $t_5$ when waveform 81 has a voltage value that is about the same as the reference value of zero line 74. Window-low data signal 86 does not transition and remains at a logic zero value when the voltage value of waveform 81 is below the voltage value of window-low reference level 73. A window-high data signal 87 does not transition and remains at a logic zero value when the voltage value of waveform 81 is below the voltage reference for window-high reference level 72. Times $t_1$, $t_2$, $t_3$, and $t_4$ are not shown in FIG. 3. The time $t_{CENTER}$ occurs at the center of the data symbol of waveform 81.

Figure 4:
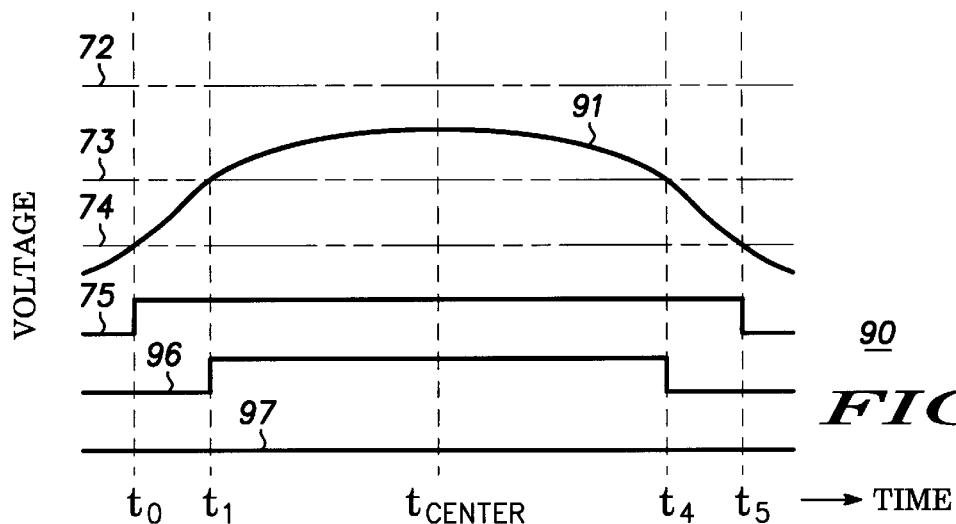
FIG. 4 is a plot of waveforms for a properly equalized input signal in accordance with the present invention.

FIG. 4 is a plot 90 of a waveform 91 for a properly equalized input signal in accordance with the present invention. The vertical direction represents a voltage amplitude while the horizontal direction represents time. Waveform 91 at the output of equalizer circuit 12 (FIG. 1) is one bit of data having a logic one value for one clock cycle. A sliced data signal 75 transitions at times $t_0$ and $t_5$ when waveform 91 has a voltage value that is about the same as the reference value of zero line 74. A window-low data signal 96 transitions at times $t_1$ and $t_4$ when waveform 91 has a voltage value that is about the same as the reference value of window-low reference level 73. A window-high data signal 97 does not transition and remains at a logic zero value when the voltage value of waveform 91 is below the voltage value of window-high reference level 72. Times $t_2$ and $t_3$ are not shown in FIG. 4. The time $t_{CENTER}$ occurs at the center of the data symbol of waveform 91.

Briefly referring to FIGS. 2, 3, and 4, it should be noted that waveforms 71, 81, and 91 are referenced to the same signal at the output of equalizer circuit 12. Over equalization results in a signal having the amplitude of waveform 71, under equalization results in a signal having the amplitude of waveform 81, and proper equalization results in a signal having the amplitude of waveform 91. It should be further noted that over equalization occurs when waveform 71 has a peak amplitude that is above window-high reference level 72. Under equalization occurs when waveform 81 has a peak amplitude that is below window-low reference level 73. Proper equalization occurs when waveform 91 has a peak amplitude that is between window-high reference level 72 and window-low reference level 73. Although window slicer 20 has been shown as providing two outputs, this is not a limitation of the present invention. In other words, window slicer 20 could have any number of outputs. The time $t_5-t_0$ is a fixed value corresponding to one symbol period. It is not a limitation of the present invention that waveforms 71, 81, and 91 cross the reference level of zero line 74 exactly at times $t_0$ and $t_5$ for all cases.

In operation, adaptive equalization circuit 10 dynamically monitors the signal received at input terminal 16 (FIG. 1) and provides appropriate equalization for that signal through an equalization value received at input 14 of equalizer circuit 12. The equalization value provides the appropriate equalization which compensates for degradation that occurred during transmission of the signal. It should be understood that the equalization value can be used to equalize either one or more data symbols. After proper equalization the logic value of the received data bit is recovered. It should be further understood that a training time period can be used to alter an initial default equalization value supplied to equalizer circuit 12.

Sliced data signal 75 is an input to delay line circuit 31 of digital phase locked loop 25. Digital phase locked loop 25 uses an external reference clock signal received at input terminal 21 to lock to the phase of sliced data signal 75. The external reference clock signal has about the same frequency as the input data received at input terminal 16. In accordance with the example, delay line circuit 31 has about twenty delay elements (not shown) and about twenty delay line tap points at output 34. Configurations for delay elements are known to those skilled in the art. For instance, the delay element can be either an inverting or a non-inverting buffer. Each delay element has a fixed throughput time of one unit delay such that the length of delay line circuit 31 is sufficient for storing one bit of data. In other words, a twenty element delay line circuit partitions a data bit into twenty segments and captures a logic value for the data bit at each segment.

The twenty delay line tap point signals at output 34 of delay line circuit 31 are stored in sampler circuit 36. The sampler clock signal at output 19 of digital PLL control circuit 26 transitions to cause the logic data values for each segment of the single data bit rippling through delay line circuit 31 to be captured and stored in sampler circuit 36.

The stored logic values are transferred from sampler circuit 36 to digital PLL control circuit 26. It is the function of digital PLL control circuit 26 to generate the sampler clock signal such that sampler circuit 36 captures the logic zero to one transition of sliced data signal 75 in the center of delay line circuit 31. For example, briefly referring to FIG. 2, the change in sliced data signal 75 from consecutive logic zero values (for times less than $t_0$) to consecutive logic one values (for times greater than $t_0$) is captured at the output of about the tenth storage element (not shown) of the twenty storage elements in sampler circuit 36. Although sampler circuit 36 is described as having twenty storage elements, it should be understood that this is not a limitation of the present invention.

It should be noted that window slicer 20 generates a pair of output signals illustrated by the signals having reference numbers of either 76 and 77, 86 and 87, or 96 and 97 in FIGS. 2, 3, and 4, respectively. The reference numbers for the pair of output signals correspond to an over-equalized waveform 71, an under-equalized waveform 81, or a properly equalized waveform 91. In other words, a signal represented as either window-high data signal 77, window-high data signal 87, or window-high data signal 97 is an input of delay line circuit 41 and either a signal represented as window-low data signal 76, window-low data signal 86, or window-low data signal 96 is an input, of delay line circuit 51.

As described hereinbefore, digital PLL control circuit 26 generates a sampler clock signal that allows sampler circuit 36 to capture the transition of sliced data signal 75 at time $t_0$ in the center of delay line circuit 31. By designing the throughput time of zero-crossing data slicer 24 to be substantially the same as the throughput time of window slicer 20 and matching the timing for the delay elements in delay line circuits 31, 41, and 51, relative timing between sampled signals can be maintained. It should be understood that differences in propagation delays for window slicer 20 and zero-crossing data slicer 24 can be compensated by using appropriate tap points in delay line circuits 31, 41, and 51.

For instance, briefly referring to FIGS. 1 and 2, when the transition of sliced data signal 75 at time $t_0$ is captured in the center of delay line circuit 31, the peak amplitude for waveform 71 occurs at a combined time of $t_0$ plus an additional half (½) of the data symbol time. It should be noted that ½ of the data symbol time is represented by the time $(t_5-t_2)/2$, which has a midpoint value of $t_{CENTER}$. Thus, at time to sliced data signal 75 transitions from a logic zero to a logic one value and is centered at the midpoint of delay line circuit 31. Given near equal propagation delays through window slicer 20 and data slicer 24 and matched delay elements in delay line circuits 31, 41, and 51, the window-high data signal sample corresponding to the center of the input data symbol of signal 71 is captured in the first storage element of sampler circuit 46. Likewise, the window-low data signal sample corresponding to the center of the input data symbol time of signal 71 is captured in the first storage element of sampler circuit 56.

For this example of over-equalized waveform 71 with the sliced data signal 75 transition properly centered in delay line circuit 31, the first storage element of sampler circuit 46 stores a logic one value in capturing the logic one portion of window-high data signal 77 that has propagated to the output of the first delay element in delay line circuit 41. Likewise, the first storage element of sampler circuit 56 stores a logic one value in capturing the logic one portion of window-low data signal 76 that has propagated to the output of the first delay element in delay line circuit 51. In response to sampler circuits 46 and 56 storing logic one values in their first storage elements, the output of adaptation control circuit 60 provides an equalization value to decrease the equalization of the signal at the output of equalizer circuit 12. Thus, the equalization of an over-equalized waveform 71 has been decreased.

FIG. 3 illustrates an under-equalized waveform 81 with the sliced data signal 75 transition properly centered in delay line circuit 31. The first storage element of sampler circuit 46 stores a logic zero value in capturing the logic zero portion of window-high data signal 87 that has propagated to the output of the first delay element in delay line circuit 41. Likewise, the first storage element of sampler circuit 56 stores a logic zero value in capturing the logic zero portion of window-low data signal 86 that has propagated to the output of the first delay element in delay line circuit 51. In response to sampler circuits 46 and 56 storing logic zero values in their first storage elements, the output of adaptation control circuit 60 provides an equalization value to increase the equalization of the signal at the output of equalizer circuit 12. Thus, the equalization of an under-equalized waveform 81 has been increased.

FIG. 4 illustrates a properly equalized waveform 91 with the sliced data signal 75 transition properly centered in delay line circuit 31. The first storage element of sampler circuit 46 stores a logic zero value in capturing the logic zero portion of window-high data signal 97 that has propagated to the output of the first delay element in delay line circuit 41. Likewise, the first storage element of sampler circuit 56 stores a logic one value in capturing the logic one portion of window-low data signal 96 that has propagated to the output of the first delay element in delay line circuit 51. In response to sampler circuit 46 storing a logic zero value and sampler circuit 56 storing a logic one value in their first storage elements, the output of adaptation control circuit 60 does not increase or decrease the equalization value provided to input 14 of equalizer circuit 12.

It should be noted that adaptive equalization circuit 10 dynamically adjusts the equalization of the signal received at input terminal 16 to provide low error rates of the signal at output terminal 18. Although adaptive equalization circuit 10 provides equalization for one signal, additional input signals can be equalized. By way of example, the signal at the output of adaptation control circuit 60 could be connected to additional equalizer circuits 12. Each additional equalizer circuit receives an equalization value as provided by an adaptation control circuit. In other words, the equalization value could be used to control more than one equalizer circuit 12. Alternatively, additional input signals could be equalized by using an adaptive equalization circuit 10 for each input signal. It is not intended that the number of input signals be a limitation of the present invention.

By now it should be appreciated that the present invention provides a circuit for dynamically adjusting the equalization value applied to each received input signal. The frequency content of the equalized signal is adjusted to account for signal losses due to communication channel distortion and provide a low error rate in the differentiation of logic one and logic zero data values. The circuit is expandable to allow equalization of multiple input signals.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For instance, adaptive equalization circuit 10 generates an equalization value that properly equalizes an input signal transitioning from a logic zero value to a logic one value as shown in FIGS. 2, 3, and 4. Alternatively, the input signal could be rectified so that a signal transitioning from a logic one value to a logic zero value would be properly equalized when the signal peak has a voltage value between the window-low reference voltage signal and window-high reference voltage signal. It should also be noted that a window-low reference voltage signal and a window-high reference voltage signal having values below the zero line reference could be used to properly equalize a logic zero signal.

What is claimed is:

1. An adaptive equalization circuit, comprising;

a digital phase locked loop having an input and an output;

a window slicer having an input and a first output;

a first timing capture circuit having a first input, a second input, a third input and an output, wherein the second input of the first timing capture circuit is coupled to the first output of the window slicer and the third input of the first timing capture circuit is coupled to the output of the digital phase locked loop;

an adaptive control circuit having a first input, a second input and an output, wherein the first input of the adaptive control circuit is coupled to the output of the first timing capture circuit;

an equalizer circuit having a first input, a second input and an output, wherein the first input of the equalizer circuit receives a data signal, the second input of the equalizer circuit is coupled to the output of the adaptive control circuit and the output is coupled to the input of the window slicer;

a delay line circuit having a first input, a second input and an output, wherein the first input of the delay line circuit serves as the first input of the first timing capture circuit, the second input of the delay line circuit serves as the second input of the first timing capture circuit; and a sampler circuit having a first input, a second input and an output, wherein the first input of the sampler circuit serves as the third input of the first timing capture circuit, the second input of the sampler circuit is coupled to the output of the delay line circuit, and the output of the sampler circuit serves as the output of the first timing capture circuit.

2. The adaptive equalization circuit of claim 1, further comprising a second timing capture circuit, wherein the second timing capture circuit comprises:

a delay line circuit having a first input, a second input and an output, wherein the first input of the delay line circuit serves as the first input of the second timing capture circuit, the second input of the delay line circuit serves as a second input of the second timing capture circuit and is coupled to the second output of the window slicer; and a sampler circuit having a first input, a second input and an output, wherein the first input of the sampler circuit serves as a third input of the second timing capture circuit and is coupled to the output of the digital phase locked loop, the second input of the sampler circuit is coupled to the output of the delay line circuit, and the output of the sampler circuit serves as an output of the second timing capture circuit and is coupled to the second input of the adaptation control circuit.

3. The adaptive equalization circuit of claim 1, wherein the digital phase locked loop further comprises:

a delay line circuit having a first input, a second input and an output;

a sampler circuit having a first input, a second input and an output, wherein the second input of the sampler circuit is coupled to the output of the delay line circuit; and a digital phase locked loop control circuit having a first input, a second input and an output, wherein the second input of the digital phase locked loop control circuit is coupled to the output of the sampler circuit, and the output of the digital phase locked loop control circuit is coupled to the first input of the sampler circuit, to the third input of the first timing capture circuit, and to the third input of the second timing capture circuit.

4. The adaptive equalization circuit of claim 3, further comprising a zero-crossing data slicer having an input and an output, wherein the input of the zero-crossing data slicer is coupled to the output of the equalizer circuit and the output of the zero-crossing data slicer is coupled to the second input of the delay line circuit in the digital phase locked loop.

5. The adaptive equalization circuit of claim 4, further comprising an analog delay locked loop circuit having an input and an output, wherein the input is coupled to the input of the digital phase locked loop, and the output is coupled to the first input of the delay line circuit of the first timing capture circuit, and to the first input of the delay line circuit of the digital phase locked loop.

\* \* \* \* \*